(12) United States Patent
Park et al.

(10) Patent No.: US 10,109,702 B2
(45) Date of Patent: Oct. 23, 2018

(54) DISPLAY DEVICE

(71) Applicant: SAMSUNG DISPLAY CO., LTD., Yongin-si, Gyeonggi-do (KR)

(72) Inventors: Junhyun Park, Suwon-si (KR); Sunghwan Kim, Yongin-si (KR); Kyoungju Shin, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/396,775

(22) Filed: Jan. 2, 2017

(65) Prior Publication Data

US 2017/0236890 A1  Aug. 17, 2017

(30) Foreign Application Priority Data

Feb. 17, 2016  (KR) .................. 10-2016-0018177

(51) Int. Cl.
*H01L 27/32* (2006.01)
*H01L 27/12* (2006.01)

(52) U.S. Cl.
CPC ...... *H01L 27/3276* (2013.01); *H01L 27/3248* (2013.01); *H01L 27/3262* (2013.01); *H01L 27/3279* (2013.01); *H01L 27/124* (2013.01)

(58) Field of Classification Search
None
See application file for complete search history.

(56) References Cited

U.S. PATENT DOCUMENTS

| 9,147,719 B2 | 9/2015 | Kim et al. |
| 9,230,998 B2 | 1/2016 | Jang et al. |
| 2013/0048990 A1* | 2/2013 | Park ............ H01L 27/124 257/59 |
| 2014/0167052 A1* | 6/2014 | Park ............ G02F 1/136286 257/59 |

FOREIGN PATENT DOCUMENTS

| KR | 1020150051824 A | 5/2015 |
| KR | 1020150073609 A | 7/2015 |
| KR | 1020150077014 A | 7/2015 |
| KR | 1020150077758 A | 7/2015 |

\* cited by examiner

*Primary Examiner* — Erik Kielin
(74) *Attorney, Agent, or Firm* — Cantor Colburn LLP (57) ABSTRACT

A display device includes: a substrate; a thin film transistor disposed on the substrate and including a semiconductor layer; an auxiliary line disposed on the substrate and including a same material as a material as that of the semiconductor layer; a gate line and a data line disposed on the substrate and connected to the thin film transistor: a first insulating layer disposed between the gate line and the auxiliary line, the first insulating layer defining a first contact hole which exposes the gate line; and a first electrode connected to the thin film transistor. The gate line contacts the auxiliary line including the same material as that of the semiconductor layer, at the first contact hole.

19 Claims, 9 Drawing Sheets

DISPLAY DEVICE

This application claims priority to Korean Patent Application No. 10-2016-0018177, filed on Feb. 17, 2016, and all the benefits accruing therefrom under 35 U.S.C. § 119, the content of which in their entirety is herein incorporated by reference.

BACKGROUND

1. Field

Exemplary embodiments of the invention relate to a display device, and more particularly, to a display device that may reduce or effectively prevent signal delays of a signal line such as a gate line and a data line.

2. Description of the Related Art

Flat panel display ("FPD") devices such as a liquid crystal display ("LCD") device and an organic light emitting diode ("OLED") display device typically include a plurality of pairs of electric-field generating electrodes and an electro-optical activation layer among the pairs of electric-field generating electrodes. The LCD device includes a liquid crystal layer as the electro-optical activation layer, and the OLED display device includes an organic light emitting layer as the electro-optical activation layer.

In general, one of a pair of the electric-field generating electrodes is connected to a switching element to receive an electric signal, and the electro-optical activation layer converts the electric signal into an optical signal to display an image.

The FPD device may use a thin film transistor ("TFT"), which is a three-terminal element, as the switching element. Further, a signal line such as a gate line transmitting a scan signal to control the TFT and a data line transmitting a signal to be applied to a first electrode are provided to the FPD device.

However, with the trend of developing a TFT display panel having a relatively large size and a relatively high degree of integration, an issue of a resistive capacitive ("RC") delay occurs. The RC delay degrades quick response characteristics of the TFT display panel to cause image quality degradation thereof. To reduce the RC delay, the data line and/or the gate line employ a relatively low electrically resistive line. In order to reduce the electrical resistance of the data line and the gate line, a planar area of the conductive lines that are used for the data line and the gate line may be expanded. However, there is a limit in expanding the planar area of the conductive lines in terms of a manufacturing process thereof.

SUMMARY

Exemplary embodiments of the invention are directed to a display device including an auxiliary line that reduces or effectively prevents resistive-capacitive ("RC") delay of a signal line.

According to an exemplary embodiment of the invention, a display device includes: a substrate; a thin film transistor disposed on the substrate and including a semiconductor layer; an auxiliary line disposed on the substrate and including a same material as that of the semiconductor layer; a gate line and a data line disposed on the substrate and connected to the thin film transistor: a first insulating layer disposed between the gate line and the auxiliary line, the first insulating layer defining a first contact hole which exposes the gate line; and a first electrode connected to the thin film transistor. The gate line contacts the auxiliary line including the same material as that of the semiconductor layer, at the first contact hole.

The auxiliary line may be disposed in a same layer as a layer in which the semiconductor layer is disposed.

The auxiliary line may be disconnected from the semiconductor layer.

The auxiliary line may be connected to the semiconductor layer.

The first electrode may be provided in plural, and the auxiliary line may be disposed between adjacent first electrodes.

The auxiliary line may overlap the gate line.

The display device may further include: a light emitting layer on the first electrode; and a second electrode on the light emitting layer.

According to another exemplary embodiment of the invention, a display device includes: a substrate; a thin film transistor disposed on the substrate and including a semiconductor layer; an auxiliary line disposed on the substrate and including a same material as that of the semiconductor layer; a gate line and a data line disposed on the substrate and connected to the thin film transistor: a first insulating layer disposed between the data line and the auxiliary line, the first insulating layer defining a second contact hole which exposes the data line; and a first electrode connected to the thin film transistor. The data line contacts the auxiliary line, at the second contact hole.

The auxiliary line may be disposed in a same layer as a layer in which the semiconductor layer is disposed.

The auxiliary line may be disconnected from the semiconductor layer.

The auxiliary line may be connected to the semiconductor layer.

The first electrode may be provided in plural and the auxiliary line may be disposed between adjacent first electrodes.

The auxiliary line may overlap the data line.

The display device may further include: a light emitting layer on the first electrode; and a second electrode on the light emitting layer.

According to another exemplary embodiment of the invention, a display device includes: a substrate; a thin film transistor disposed on the substrate and including a semiconductor layer; a first auxiliary line and a second auxiliary line disposed on the substrate and each including a same material as that of the semiconductor layer; a gate line and a data line disposed on the substrate and connected to the thin film transistor: a first insulating layer disposed between the gate line and the first auxiliary line, the first insulating layer defining a first contact hole which exposes the gate line; and a second insulating layer disposed between the data line and the second auxiliary line, the second insulating layer defining a second contact hole which exposes the data line; and a first electrode connected to the thin film transistor. The gate line contacts the first auxiliary line, at the first contact hole, and the data line contacts the second auxiliary line, at the second contact hole.

The first auxiliary line and the second auxiliary line may each be disposed in a same layer as a layer in which the semiconductor layer is disposed.

The first auxiliary line may be disconnected from the second auxiliary line.

The first auxiliary line may be connected to the semiconductor layer.

The second auxiliary line may be connected to the semiconductor layer.

The first electrode may be provided in plural, and the first auxiliary line and the second auxiliary line may be respectively disposed between adjacent first electrodes.

The foregoing is illustrative only and is not intended to be in any way limiting. In addition to the illustrative embodiments, and features described above, further embodiments, and features will become apparent by reference to the drawings and the following detailed description.

BRIEF DESCRIPTION OF THE DRAWINGS

The above and other features of the present disclosure of invention will be more clearly understood from the following detailed description taken in conjunction with the accompanying drawings, in which.

DETAILED DESCRIPTION

Exemplary embodiments will now be described more fully hereinafter with reference to the accompanying drawings. Although the invention can be modified in various manners and have several embodiments, exemplary embodiments are illustrated in the accompanying drawings and will be mainly described in the specification. However, the scope of the invention is not limited to the exemplary embodiments and should be construed as including all the changes, equivalents, and substitutions included in the spirit and scope of the invention.

In the drawings, certain elements or shapes may be illustrated in an enlarged manner or in a simplified manner to better illustrate the invention, and other elements present in an actual product may also be omitted. Thus, the drawings are intended to facilitate the understanding of the invention.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly (physically) connected" to the other element, or "electrically connected" to the other element with one or more intervening elements interposed therebetween. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the invention, and like reference numerals refer to like elements throughout the specification.

Hereinafter, an exemplary embodiment of a display device will be described with reference to FIGS. 1, 2 and 3. Hereinafter, the display device will be described as a liquid crystal display ("LCD") device including a top-gate thin film transistor, but the invention is not limited thereto.

Figure 1:
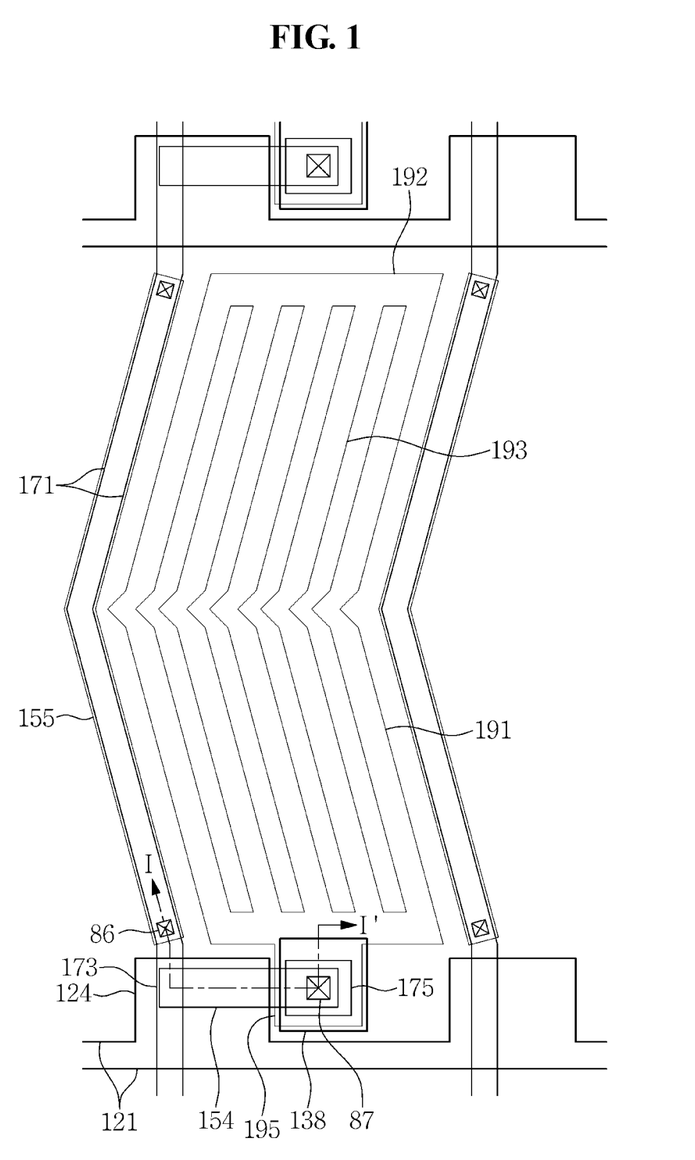
FIG. 1 is a schematic top plan view illustrating an exemplary embodiment of a display device.

FIG. 1 is a schematic top plan view illustrating an exemplary embodiment of a display device; FIG. 2 is a cross-sectional view taken along line I-I' of FIG. 1; and FIG. 3 is a schematic top plan view illustrating an exemplary embodiment of an auxiliary line and a data line of the display device of FIG. 1.

Figure 2:
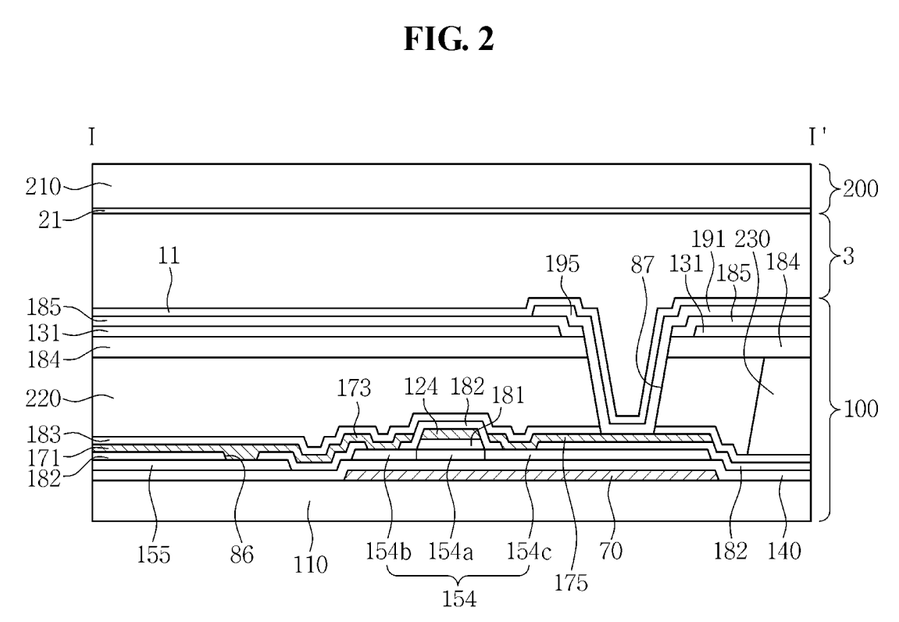
FIG. 2 is a cross-sectional view taken along line I-I' of FIG. 1.
Figure 3:
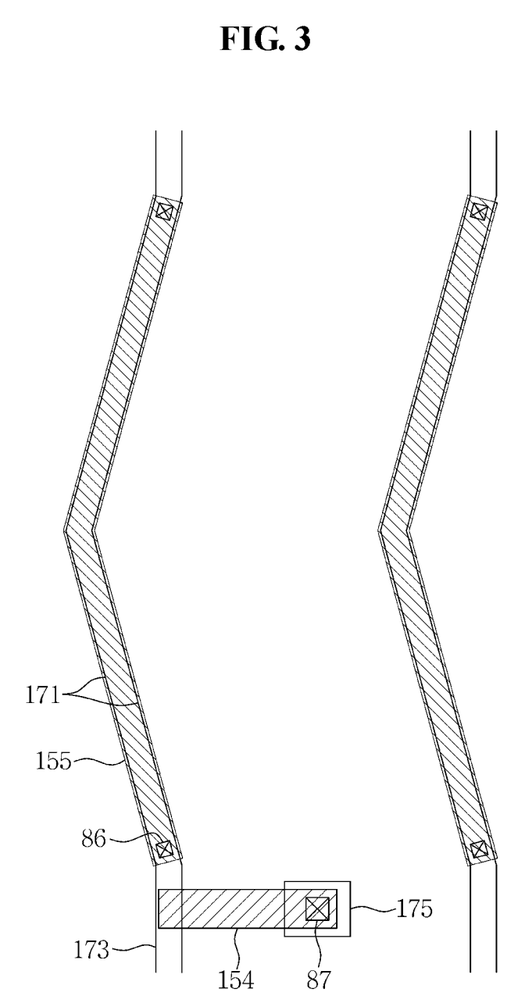
FIG. 3 is a schematic top plan view illustrating an exemplary embodiment of an auxiliary line and a data line of the display device of FIG. 1.

Referring to FIGS. 1, 2 and 3, the exemplary embodiment of the LCD device includes a lower display panel 100 and an upper display panel 200 that oppose each other, and a liquid crystal layer 3 between the lower display panel 100 and the upper display panel 200 as an electro-optical activation layer converts the electric signal into an optical signal to display an image.

Hereinafter, the lower display panel 100 will be described. A pixel may be provided in plural in the lower display panel 100. The pixels may be disposed in a display area of the display device at which an image is displayed. The image may not be displayed in a non-display area of the display device. The pixel may include a pixel area at which light is transmitted or the image is displayed, and a non-pixel area at which light is not transmitted or the image is not displayed.

A light blocking layer 70 may be disposed on a first substrate 110. The first substrate 110 may include or be formed of glass or plastic. The light blocking layer 70 reduced or effectively prevents light from reaching a semiconductor layer 154, which is above the light blocking layer 70, so that the semiconductor layer 154 may not lose characteristics of a semiconductor by light incident thereto. Accordingly, the light blocking layer 70 may include a material that does not transmit light in a wavelength range of light to be blocked so that the light in the wavelength range to be blocked may not reach the semiconductor layer 154. The light blocking layer 70 may include an organic insulating material, an inorganic insulating material and/or a conductive material such as metal, and may have a monolayer structure, single-layer structure or a multilayer structure.

A buffer layer 140 is disposed on the light blocking layer 70. The buffer layer 140 may include an insulating oxide such as silicon oxides ($SiO_x$), aluminum oxide ($Al_2O_3$), hafnium oxide ($HfO_3$) and yttrium oxide ($Y_2O_3$). The buffer layer 140 reduces or effectively prevents permeation of impurities from the first substrate 110 into the semiconductor layer 154 which is above the first substrate 110, and thus may protect the semiconductor layer 154 and improve interfacial properties of the semiconductor layer 154. A cross-sectional thickness of the buffer layer 140 may be in a range of about 0.5 micrometer ($\mu m$) to about 1 $\mu m$, but exemplary embodiments are not limited thereto.

The semiconductor layer 154 is disposed on the buffer layer 140. The semiconductor layer 154 overlaps portions of a gate electrode 124, a source electrode 173 and a drain electrode 175.

The semiconductor layer 154 may include amorphous silicon, polycrystalline silicon or an oxide semiconductor, for example. The oxide semiconductor may include at least one selected from: zinc (Zn), gallium (Ga), indium (In), and tin (Sn).

In an exemplary embodiment, for example, the oxide semiconductor may include an oxide semiconductor material such as an oxide based on zinc (Zn), gallium (Ga), indium (In) or tin (Sn), or a composite oxide, e.g., zinc oxides (ZnO), indium-gallium-zinc oxides ($InGaZnO_4$), indium-zinc oxides (In—Zn—O) or zinc-tin oxides (Zn—Sn—O).

In an exemplary embodiment, for example, the oxide semiconductor may include an IGZO-based oxide that includes indium (In), gallium (Ga), zinc (Zn), and oxygen (O). In addition, the oxide semiconductor may include In—Sn—Zn—O-based metal oxides, In—Al—Zn—O-based metal oxides, Sn—Ga—Zn—O-based metal oxides, Al—Ga—Zn—O-based metal oxides, Sn—Al—Zn—O-based metal oxides, In—Zn—O-based metal oxides, Sn—Zn—O-based metal oxides, Al—Zn—O-based metal oxides, In—O-based metal oxides, Sn—O-based metal oxides or Zn—O based metal oxides.

Where the light blocking layer 70 is provided, the semiconductor layer 154 may be covered by the light blocking layer 70, that is, an entirety of the semiconductor layer 154 may be overlapped by the light blocking layer 70. Among areas of the semiconductor layer 154, a source area 154b and a drain area 154c are disposed in opposite sides with respect to a channel area 154a and are separated from each other. In addition, the source area 154b and the drain area 154c are connected to the channel area 154a. The source area 154b and the drain area 154c have conductivity and may include a same material as a semiconductor material included in the channel area 154a and as a reduced semiconductor material. A metal such as indium (In) included in the semiconductor material may be deposited on a surface of the source area 154b and the drain area 154c.

An auxiliary line 155 is disposed on the buffer layer 140. The auxiliary line 155 is disposed in a same layer as a layer in which the semiconductor layer 154 is disposed, among layers of the lower display panel 100 on the first substrate 110. The auxiliary line 155 includes a same material or is formed from a same material layer as that of the semiconductor layer 154. The auxiliary line 155 contacts a data line 171 which is to be described below with respect to the exemplary embodiment. The auxiliary line 155 is spaced apart and disconnected from the semiconductor layer 154 and is disposed among first electrodes 191 to be described below. In addition, the auxiliary line 155 overlaps the data line 171.

A first insulating layer 181 is disposed on the channel area 154a. The first insulating layer 181 may cover the channel area 154a. In addition, the first insulating layer 181 may not substantially overlap the source area 154b and the drain area 154c. The first insulating layer 181 may have a structure among a monolayer, single layer or a multilayer including two or more layers. The first insulating layer 181 may include insulating oxides such as silicon oxides ($SiO_x$), aluminum oxide ($Al_2O_3$), hafnium oxide ($HfO_3$) and yttrium oxide ($Y_2O_3$). The first insulating layer 181 may improve interfacial properties of the channel area 154a and reduce or effectively prevent permeation of impurities into the channel area 154a. According of the exemplary embodiment in FIGS. 1-3, the first insulating layer 181 is not only disposed or formed on the channel area 154a, but is also disposed or formed in an area in which a gate line 121 is disposed, which is to be described below.

The gate line 121 is provided in plurality on the first insulating layer 181. The gate lines 121 transmit a gate signal. The gate line 121 defines a width thereof and a length thereof which is larger than the width and substantially extends in a transverse direction (e.g., horizontal in FIG. 1 or first direction). Each of the gate lines 121 includes or defines a plurality of gate electrodes 124. The gate line 121 and the gate electrodes 124 may be disposed in a same layer or formed from a same material layer as each other, among layers on the first substrate 110 of the lower display panel 100.

In the top plan view, a boundary edge of the gate electrode 124 and a boundary edge of the first insulating layer 181 may be aligned to substantially correspond to one another. That is, the first insulating layer 181 may be only disposed under the gate electrode 124 and the gate line 121.

The gate electrode 124 defines a portion thereof overlapping the channel area 154a, and the channel area 154a is covered by the gate electrode 124. The source area 154b and the drain area 154c are disposed at opposite sides of the channel area 154a, respectively, with respect to the gate electrode 124, and the source area 154b and the drain area 154c may not substantially overlap the gate electrode 124. Accordingly, a parasitic capacitance between the gate electrode 124 and the source area 154b or a parasitic capacitance between the gate electrode 124 and the drain area 154c may be reduced.

The gate electrode 124 may include or be formed of a metal selected from: aluminum (Al), silver (Ag), copper (Cu), molybdenum (Mo), chromium (Cr), tantalum (Ta), and/or titanium (Ti) or alloys thereof. The gate electrode 124 may have a monolayer structure or a multilayer structure. Examples of the multilayer structure may include: a double-layer structure including a lower layer including titanium (Ti), tantalum (Ta), molybdenum (Mo), and/or ITO and an upper layer including copper (Cu); and a triple-layer structure including molybdenum (Mo)-aluminum (Al)-molybdenum (Mo). However, the gate electrode 124 may include or be formed of any suitable metals or conductors rather than the aforementioned materials.

A second insulating layer 182 is disposed or formed on the gate line 121 and the auxiliary line 155. The second insulating layer 182 may include an inorganic insulating material such as silicon nitrides ($SiN_x$) or silicon oxides ($SiO_x$). The second insulating layer 182 is disposed between the data line 171, to be described below, and portions of the auxiliary line 155 defines a second contact hole 86 that exposes the data line 171.

A data conductor including the data line 171 and the source electrode 173 provided in plurality and the drain electrode 175 provided in plurality, is disposed or formed on the second insulating layer 182. The data line 171, the source electrode 173 and the drain electrode 175 may be disposed in a same layer or formed from a same material layer as each other, among layers on the first substrate 110 of the lower display panel 100.

The data lines 171 transmit a data signal. The data line defines a width thereof and a length thereof which is larger than the width and substantially extends in a longitudinal direction (e.g., vertical in FIG. 1 or second direction) to cross the gate line 121. Each of the data lines 171 includes or defines the source electrode 173 provided in plurality and overlapping the gate electrode 124. In a plan view, the data line 171 is bent periodically and forms an oblique angle with an extension (e.g., length) direction of the gate line 121. The oblique angle between the data line 171 and the extension direction of the gate line 121 may be greater than or equal to about 45 degrees.

The data line 171 contacts the auxiliary line 155 at and through the second contact hole 86 of the second insulating layer 182. The auxiliary line 155 that includes a same material or is formed from a material layer as the semiconductor layer 154 is connected to the data line as a signal line such that a resistive-capacitive ("RC") delay of the signal line may be improved. Since the data line 171 is connected to the auxiliary line 155, the data line 171 may function as a double (signal) line, and a signal delay may be reduced in the data line 171.

The drain electrode 175 opposes the source electrode 173 with respect to the gate electrode 124 and may have an island pattern. In the top plan view, the drain electrode 175 has a discrete shape which is spaced apart from the source electrode 173 and the gate electrode 124.

The gate electrode 124, the source electrode 173 and the drain electrode 175, along with the semiconductor layer 154, define a thin film transistor ("TFT") which is a switching element.

A third insulating layer 183 is disposed on the data line 171 and the drain electrode 175. The third insulating layer 183 may include an organic insulating material or an inorganic insulating material, for example.

A light blocking member 220, also referred to as a black matrix, is disposed or formed on a portion of the third insulating layer 183 corresponding to the gate line 121, the data line 171 and the thin film transistor ("TFT"), and a color filter 230 is provided in plurality in a pixel area defined by and between portions of the light blocking member 220. Each of the color filters 230 may distinctly display one of primary colors. Examples of the primary colors may include three primary colors of red, green and blue, and primary colors of yellow, cyan and magenta.

In an alternative exemplary embodiment, the light blocking member 220 may be omitted from the first substrate 110 and within the lower display panel 100. The color filter 230 may define a width thereof and a length thereof larger than the width and extending along an extension direction of the data line 171. Two adjacent color filters 230 may overlap each other with the data line 171 as a border thereamong. That is, the color filter 230 may also be formed on a portion of the third insulating layer 183 corresponding to the gate line 121, the data line 171 and the thin film transistor TFT.

A fourth insulating layer 184 is disposed on the color filter 230. The fourth insulating layer 184 may include an organic material and may have a planar surface. The fourth insulating layer 184 reduces step differences among respective color filters 230 that are disposed in adjacent pixels of the display device so that a first alignment layer 11 may be uniformly rubbed.

However, the fourth insulating layer 184 may be an inorganic insulating layer and may reduce or effectively prevent components of the color filter 230 from being exposed. In such an exemplary embodiment, the fourth insulating layer 184 may reduce or effectively prevent deformation or discoloration of the color filter 230 therebelow.

A second electrode 131 (e.g., a common electrode) is provided in plurality on the fourth insulating layer 184. The second electrode 131 functions as a common electrode. The second electrode 131 may include a transparent conductive material such as indium tin oxide ("ITO") or indium zinc oxide ("IZO"). The second electrode 131 may have a planar shape, may be formed as a whole-plate electrode over an entire surface of the first substrate 110. Portions of the second electrode 131 may define an aperture 138 at a portion of the second electrode 131 corresponding to vicinity of the drain electrode 175.

A fifth insulating layer 185 is disposed on the second electrode 131. The fifth insulating layer 185 may include an organic insulating material or an inorganic insulating material.

The first electrode 191 is disposed on the fifth insulating layer 185. The first electrode 191 may be provided in plurality in the display device, such as corresponding to pixel areas. The auxiliary line 155 is between adjacent first electrodes 191 of respectively adjacent pixels in the first (horizontal) direction.

The first electrode 191 functions as a pixel electrode. The first electrode 191 includes or defines a branch electrode 193 provided in plurality that are spaced apart from one another. The branch electrode 193 defines a width thereof and a length thereof which is larger than the width and extends substantially parallel to one another. The first electrode 191 may also include or define lower and upper transverse portions 192 thereof that connect upper and lower end portions of the plurality of branch electrodes 193, respectively. In the top plan view, the branch electrode 193 of the first electrode 191 may be bent similar to the shape or profile of the data line 171. In addition, portions of the first electrode 191 may further include or define a first electrode protrusion 195 that defines a length thereof which extends toward the drain electrode 175 in the top plan view. The first electrode protrusion 195 may directly contact the drain electrode 175. The first electrode 191 may include a transparent conductive material such as indium tin oxide ("ITO") or indium zinc oxide ("IZO").

The first electrode 191 is electrically connected to the drain electrode 175 at a third contact hole 87 to receive a data voltage from the drain electrode 175. The first electrode 191 applied with the data voltage and the second electrode 131 applied with a common voltage generate an electric field in the overlapping the liquid crystal layer 3.

The branch electrode 193 of the first electrode 191 overlaps the second electrode 131 which has a planar shape.

In the exemplary embodiment of the LCD device in FIGS. 1-3, the second electrode 131 covers the entirety of the plurality of data lines 171 and overlaps the data line 171. Accordingly, crosstalk between the data line 171 and the first electrode 191 may be reduced and light leakage that is caused due to a parasitic capacitance between the data line 171 and an adjacent portion of the first electrode 191 may be reduced.

The first alignment layer 11 is coated over an inner surface of the lower display panel 100.

Hereinafter, the upper display panel 200 will be described.

A second alignment layer 21 is coated on a second substrate 210.

The first alignment layer 11 and the second alignment layer 21 may be a horizontal-alignment layer.

The liquid crystal layer 3 between the lower display panel 100 and the upper display panel 200 includes liquid crystal molecules (not illustrated). The liquid crystal molecules may be aligned so that a major axis of the liquid crystal molecules is perpendicular to surfaces of the lower display panel 100 and the upper display panel 200 in the absence of an electric field.

The liquid crystal layer 3 may have a positive dielectric anisotropy, or alternatively, may have a negative dielectric anisotropy. The liquid crystal molecules of the liquid crystal layer 3 may be aligned to be pretilted in a predetermined direction, and the pretilted direction of the liquid crystal molecules may vary based on the dielectric anisotropy of the liquid crystal layer 3.

A backlight unit (not illustrated) which may provide light to the lower display panel 100 and the upper display panel 200 may further be provided outside the first substrate 110 of the lower display panel 100.

The first electrode 191 applied with the data voltage and the second electrode 131 applied with the common voltage generate an electric field in the overlying liquid crystal layer 3 such that orientation of the liquid crystal molecules of the liquid crystal layer 3 is determined and a corresponding image is displayed.

Hereinafter, another exemplary embodiment of the display device will be described with reference to FIGS. 4, 5 and 6. The same configurations as configurations of the exemplary embodiment in FIGS. 1-3 will be omitted for conciseness. In the exemplary embodiment of the display device of FIGS. 4-6, an LCD device includes a top-gate thin film transistor.

Figure 4:
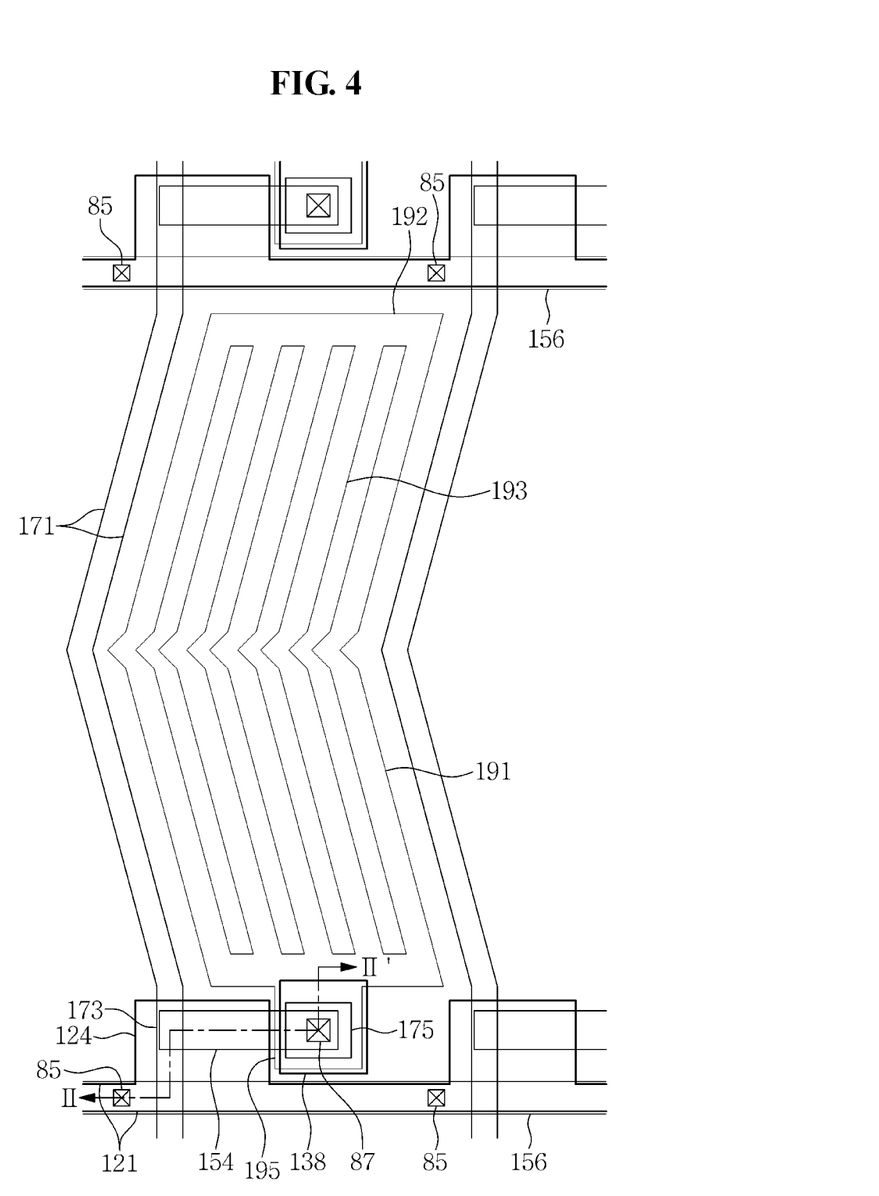
FIG. 4 is a schematic top plan view illustrating another exemplary embodiment of a display device.

FIG. 4 is a schematic top plan view illustrating another exemplary embodiment of a display device; FIG. 5 is a cross-sectional view taken along line II-II' of FIG. 4; and FIG. 6 is a schematic top plan view illustrating an exemplary embodiment of an auxiliary line and a gate line of the display device of FIG. 4.

Figure 5:
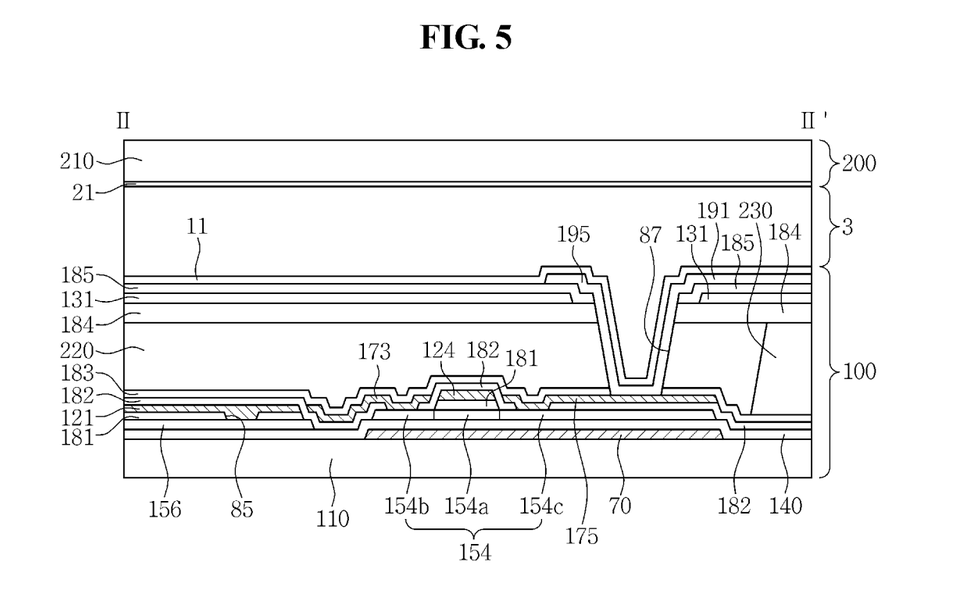
FIG. 5 is a cross-sectional view taken along line II-IP of FIG. 4.
Figure 6:
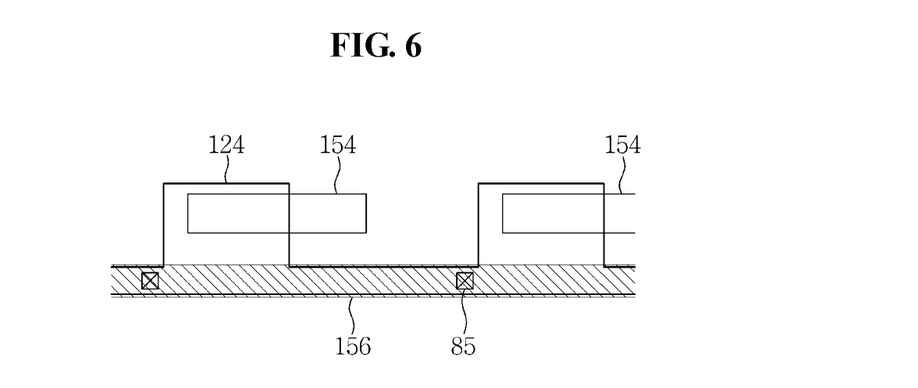
FIG. 6 is a schematic top plan view illustrating an exemplary embodiment of an auxiliary line and a gate line of the display device of FIG. 4.

Referring to FIGS. 4, 5, and 6 according to the exemplary embodiment, an auxiliary line 156 is disposed on a buffer layer 140. The auxiliary line 156 is disposed in a same layer as a layer in which a semiconductor layer 154 is disposed, and includes a same material or is formed from a material layer as the semiconductor layer 154. The auxiliary line 156 contacts a gate line 121, different from the exemplary embodiment in FIGS. 1-3. The auxiliary line 156 is spaced apart from and disconnected from the semiconductor layer 154 and is disposed among first electrodes 191. In addition, the auxiliary line 156 overlaps the gate line 121. The auxiliary line 156 is between adjacent first electrodes 191 of respectively adjacent pixels in the second (vertical) direction.

A first insulating layer 181 is disposed or formed on the auxiliary line 156.

The gate line 121 is provided in plurality on the first insulating layer 181. The gate line 121 contacts the auxiliary line 156 at a first contact hole 85 defined by portions of the first insulating layer 181. The auxiliary line 155 that includes a same material or is formed from a material layer as the semiconductor layer 154 is connected to the gate line as a signal line such that a resistive-capacitive ("RC") delay of the signal line may be improved. Since the gate line 121 is connected to the auxiliary line 156, the gate line 121 may function as a double line, and a signal delay may be reduced in the gate line 121.

Hereinafter, still another exemplary embodiment of the display device will be described with reference to FIG. 7. The same configurations as configurations of the exemplary embodiments in FIGS. 1-6 will be omitted for conciseness. In the exemplary embodiment of the display device in FIG. 7, an LCD device including a top-gate thin film transistor is described.

Figure 7:
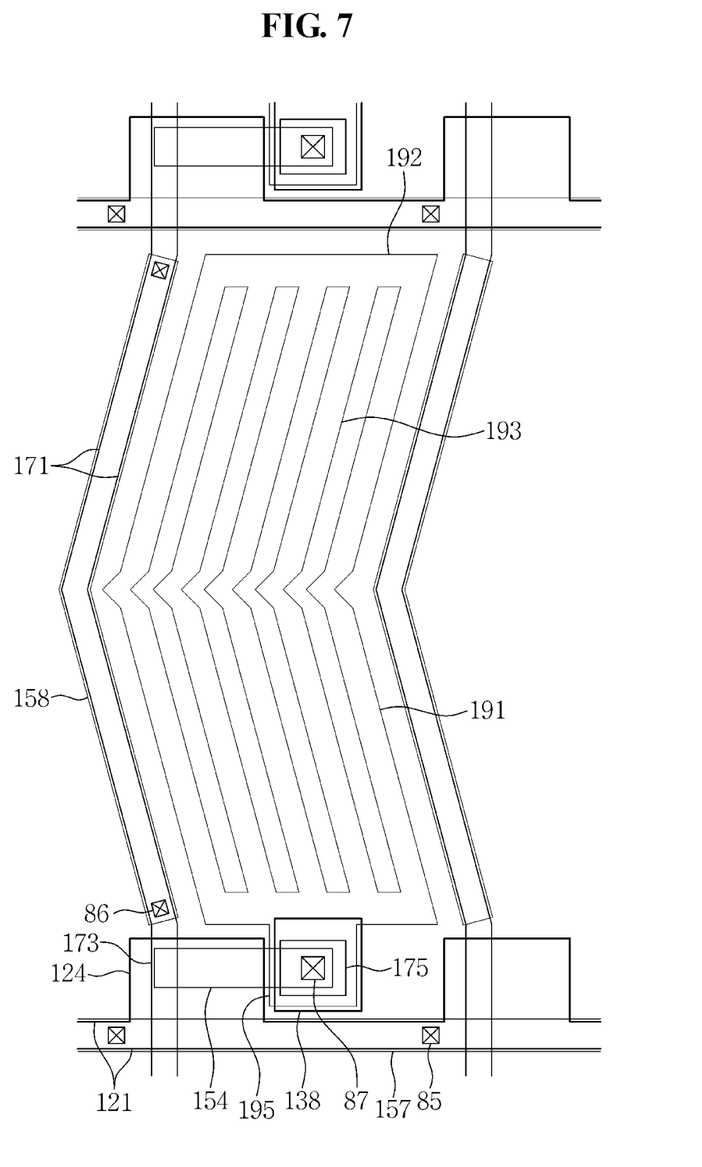
FIG. 7 is a schematic top plan view illustrating still another exemplary embodiment of a display device.

In the exemplary embodiment of the display device in FIG. 7, for ease of description, an auxiliary line contacting a gate line 121 is referred to as a first auxiliary line, and an auxiliary line contacting a data line 171 is referred to as a second auxiliary line.

FIG. 7 is a schematic top plan view illustrating yet another exemplary embodiment of a display device.

According to the exemplary embodiment, referring to FIG. 7, a first auxiliary line 157 is disposed on a buffer layer 140 (refer to FIG. 5). The first auxiliary line 157 is disposed in a same layer as a layer in which a semiconductor layer 154 is disposed and includes a same material or is formed from a material layer as the semiconductor layer 154. The first auxiliary line 157 contacts the gate line 121. The first auxiliary line 157 is spaced apart from and disconnected from the semiconductor layer 154 and is disposed among first electrodes 191. In addition, the first auxiliary line 157 overlaps the gate line 121. The first auxiliary line 157 is between adjacent first electrodes 191 of respectively adjacent pixels in the second (vertical) direction.

In addition, a second auxiliary line 158 is disposed on the buffer layer 140. The second auxiliary line 158 is disposed in the same layer as the layer in which the semiconductor layer 154 is disposed and includes the same material or is formed from the same material layer as the semiconductor layer 154. The second auxiliary line 158 contacts the data line 171. The second auxiliary line 158 is spaced apart from and disconnected from the semiconductor layer 154 and is disposed among the first electrodes 191. In addition, the second auxiliary line 158 overlaps the data line 171. In an exemplary embodiment, the first auxiliary line 157 and the second auxiliary line 158 transmit different signals from each other, and thus the first auxiliary line 157 is spaced apart from and disconnected from the second auxiliary line 158.

A first insulating layer 181 (refer to FIG. 5) is formed on the first auxiliary line 157.

The gate line 121 is provided in plurality on the first insulating layer 181. The gate line 121 contacts the first auxiliary line 157 at a first contact hole 85 (refer to FIG. 5) of the first insulating layer 181. Since the gate line 121 is connected to the first auxiliary line 157, the gate line 121 may function as a double line, and a signal delay may be reduced in the gate line 121.

A second insulating layer 182 (refer to FIG. 2) is disposed on the gate line 121, and the data line 171 is disposed on the second insulating layer 182. The data line 171 contacts the second auxiliary line 158 at a second contact hole 86 (refer to FIG. 2) of the second insulating layer 182. Since the data line is connected to the second auxiliary line 158, the data line 171 may function as a double line, and a signal delay may be reduced in the data line 171.

Hereinafter, yet another exemplary embodiment of the display device will be described with reference to FIG. 8. The same configurations as configurations of the exemplary embodiment of FIGS. 1-3 will be omitted for conciseness. In the exemplary embodiment of the display device of FIG. 8, an LCD device including a bottom-gate thin film transistor.

Figure 8:
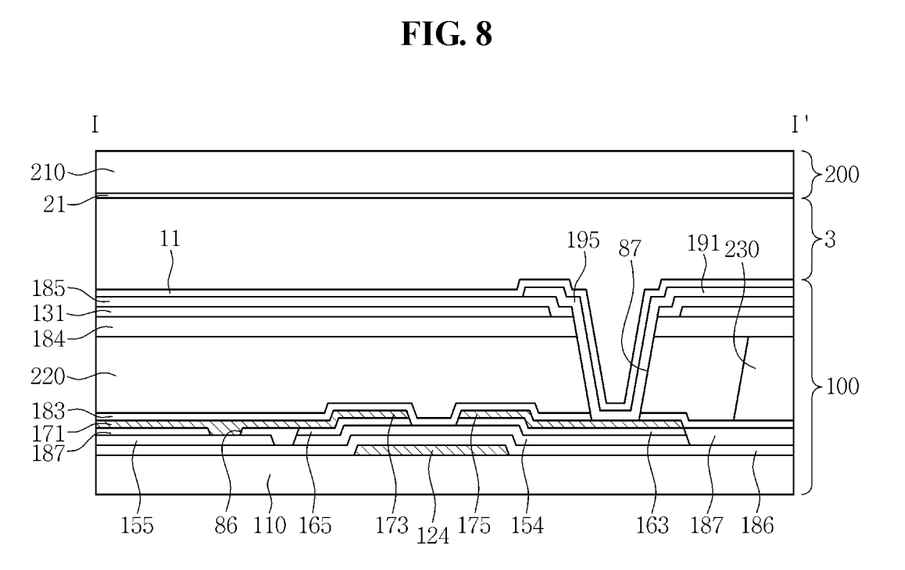
FIG. 8 is a cross-sectional view illustrating a modified exemplary embodiment of the display device in FIG. 1.

FIG. 8 is a cross-sectional view illustrating a modified exemplary embodiment of the display device in FIG. 1. FIG. 8 is a cross-sectional view taken along line I-I' of FIG. 1.

Hereinafter, a lower display panel 100 will be described with reference to FIGS. 1 and 8.

A gate line 121 is provided in plurality on a first substrate 110.

The gate lines 121 transmit a gate signal and define a length thereof which substantially extends in a transverse direction. Each of the gate lines 121 includes or defines a plurality of gate electrodes 124.

A first insulating layer 186 is disposed or formed on the gate line 121. The first insulating layer 186 may include an inorganic insulating material such as silicon nitrides ($SiN_x$) or silicon oxides ($SiO_x$).

A semiconductor layer 154 is provided in plurality on the first insulating layer 186. The semiconductor layer 154 may define a length thereof which extends along an extension of a gate electrode 124 with respect to a main portion of the gate line 121.

The semiconductor layer 154 may include amorphous silicon, polycrystalline silicon or an oxide semiconductor, for example. The oxide semiconductor may include at least one selected from: zinc (Zn), gallium (Ga), indium (In) and tin (Sn).

In an exemplary embodiment, for example, the oxide semiconductor may include an oxide semiconductor material such as an oxide based on zinc (Zn), gallium (Ga), indium (In) or tin (Sn), or a composite oxide, e.g., zinc oxides (ZnO), indium-gallium-zinc oxides ($InGaZnO_4$), indium-zinc oxides (In—Zn—O) and zinc-tin oxides (Zn—Sn—O).

In an exemplary embodiment, for example, the oxide semiconductor may include an IGZO-based oxide that includes indium (In), gallium (Ga), zinc (Zn) and oxygen (O). In addition, the oxide semiconductor may include In—Sn—Zn—O-based metal oxides, In—Al—Zn—O-based metal oxides, Sn—Ga—Zn—O-based metal oxides, Al—Ga—Zn—O-based metal oxides, Sn—Al—Zn—O-based metal oxides, In—Zn—O-based metal oxides, Sn—Zn—O-based metal oxides, Al—Zn—O-based metal oxides, In—O-based metal oxides, Sn—O-based metal oxides, and Zn—O based metal oxides.

An auxiliary line 155 is disposed on the first insulating layer 186. The auxiliary line 155 is disposed in a same layer as a layer in which the semiconductor layer 154 is disposed and includes a same material or is formed from a same material layer as the semiconductor layer 154. The auxiliary line 155 contacts a data line 171 which is to be described below with respect to the exemplary embodiment in FIG. 8. The auxiliary line 155 is spaced apart and disconnected from the semiconductor layer 154 and is disposed among first electrodes 191 to be described below. In addition, the auxiliary line 155 overlaps the data line 171.

A second insulating layer 187 is disposed on the auxiliary line 155. The second insulating layer 187 defines a second contact hole 86 that exposes the auxiliary line 155.

Ohmic contact members 163 and 165 are provided in plurality on the semiconductor layer 154. The ohmic contact members 163 and 165 oppose one another to form a pair with respect to the gate electrode 124 and are disposed on the semiconductor layer 154.

The ohmic contact members 163 and 165 may include silicide or n+ hydrogenated amorphous silicon doped with n-type impurities, such as phosphorus (P), at relatively high concentration.

A data conductor including the plurality of data lines 171, a plurality of source electrodes 173 and a plurality of drain electrodes 175 is formed on the ohmic contact members 163 and 165.

The data lines 171 transmit a data signal and define a length thereof which substantially extends in a longitudinal direction to cross the gate line 121. Each of the data lines 171 includes or defines a source electrode 173 provided in plurality and which respectively overlap the gate electrode 124. In the top plan view, the data line 171 is bent periodically and forms an oblique angle with an extension direction of the gate line 121.

The data line 171 contacts the auxiliary line 155 at the second contact hole 86 of the second insulating layer 187. Since the data line 171 is connected to the auxiliary line 155, the data line 171 may function as a double line, and a signal delay may be reduced in the data line 171.

The drain electrode 175 opposes the source electrode 173 with respect to the gate electrode 124 and may have an island pattern.

The gate electrode 124, the source electrode 173 and the drain electrode 175, along with the semiconductor layer 154, define a thin film transistor ("TFT") which is a switching element.

Other configurations of the exemplary embodiment in FIG. 8 are the same as the configurations of the exemplary embodiment in FIGS. 1-3, and thus descriptions pertaining thereto will be omitted.

In an exemplary embodiment, although not illustrated, even for a bottom-gate type thin film transistor, the gate line 121 may contact the auxiliary line 155 as illustrated in the second exemplary embodiment, and the auxiliary line 155 may be connected to each of the gate line 121 and the data line 171 as illustrated in the third exemplary embodiment.

Hereinafter, yet another exemplary embodiment of a display device will be described with reference to FIG. 9. The same configurations as configurations of the exemplary embodiment of FIGS. 1-3 will be omitted for conciseness. In the exemplary embodiment of the display device of FIG. 9, an organic light emitting diode ("OLED") device is described as including a bottom-gate thin film transistor.

Figure 9:
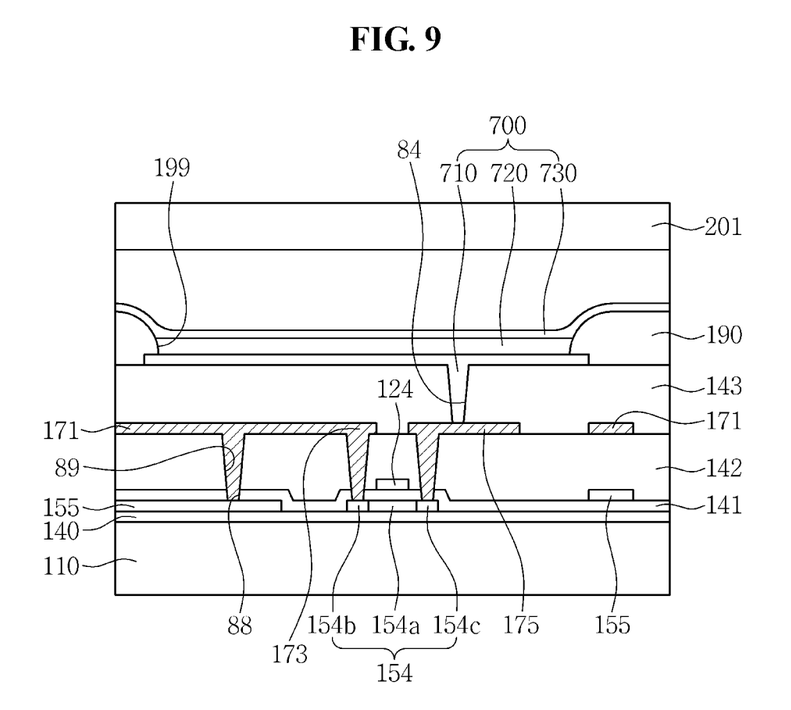
FIG. 9 is a cross-sectional view illustrating yet another exemplary embodiment of a display device.

FIG. 9 is a cross-sectional view illustrating yet another exemplary embodiment of a display device.

Referring to FIG. 9, a first substrate 110 may be an insulating substrate including or being formed of one selected from glass, quartz, ceramic, plastic and the like. However, exemplary embodiments are not limited thereto, and the first substrate 110 may include a metal substrate including metal such as stainless steel.

A buffer layer 140 is formed on the first substrate 110. The buffer layer 140 is configured to reduce or effectively prevent or efficiently reduce permeation of undesirable elements and to planarize a surface of the first substrate 110, and includes various materials that may serve the aforementioned functions. In an exemplary embodiment, for example, the buffer layer 140 may include or be formed of at least one material selected from: silicon nitrides ($SiN_x$), silicon oxides ($SiO_2$), and silicon oxynitrides ($SiO_xN_y$). However, the buffer layer 140 is not invariably necessarily, and may be omitted in consideration of the kinds and process conditions of the first substrate 110.

A semiconductor layer 154 is disposed or formed on the buffer layer 140. The semiconductor layer 154 may include at least one semiconductor material selected from polycrystalline silicon, amorphous silicon and oxide semiconductors. Further, the semiconductor layer 154 includes or defines a channel area 154a that is not doped with impurities and p+ doped source and drain areas 154b and 154c that are disposed at opposite sides of the channel area 154a. In such an exemplary embodiment, p-type impurities, such as boron B, may be used as a dopant ion, and in particular, $B_2H_6$ may be used. Such impurities may vary depending on the kinds of the thin film transistor.

An auxiliary line 155 is disposed on the buffer layer 140. The auxiliary line 155 is disposed in a same layer as a layer in which the semiconductor layer 154 is disposed and includes a same material or is formed from a material layer as the semiconductor layer 154. The auxiliary line 155 contacts a data line 171 which is to be described below with respect to the exemplary embodiment of FIG. 9. The auxiliary line 155 is spaced apart and disconnected from the semiconductor layer 154 and is disposed among first electrodes 191 to be described below. In addition, the auxiliary line 155 overlaps the data line 171.

A gate insulating layer 141, including silicon nitrides ($SiN_x$) or silicon oxides ($SiO_x$), is disposed or formed on the semiconductor layer 154 and the auxiliary line 155. The gate insulating layer 141 may include at least one selected from tetra ethyl ortho silicate ("TEOS"), silicon nitrides ($SiN_x$), and silicon oxides ($SiO_2$). In an exemplary embodiment, for example, the gate insulating layer 141 may have a double-layer structure where a $SiN_x$ layer having a thickness of about 40 nanometers (nm) and a TEOS layer having a thickness of about 80 nm are sequentially stacked. However, the gate insulating layer 141 of the exemplary embodiment is not limited to the aforementioned configurations.

In an exemplary embodiment, portions of the gate insulating layer 141 define a fourth contact hole 88 that exposes the auxiliary line 155.

A gate electrode 124 and a gate line (not illustrated) are disposed or formed on the gate insulating layer 141. In such an exemplary embodiment, the gate electrode 124 overlaps at least a portion of the semiconductor layer 154, for example, the channel area 154a. In an exemplary embodiment of manufacturing the display device, the gate electrode 124 serves to reduce or effectively prevent the channel area 154a from being doped with impurities when the source and drain areas 154b and 154c of the semiconductor layer 154 are doped with the impurities in the process of forming the semiconductor layer 154.

The gate electrode 124 includes or is formed or a metal material. In such an exemplary embodiment, the metal material may include at least one selected from: molybdenum (Mo), chromium (Cr), and tungsten (W). In an exemplary embodiment, for example, the gate electrode 124 may include molybdenum (Mo) or molybdenum alloys.

An insulating interlayer 142, covering the gate electrode 124, is disposed or formed on the gate insulating layer 141. The insulating interlayer 142 may include or be formed of silicon nitrides ($SiN_x$) or silicon oxides ($SiO_x$), which is substantially similar to the gate insulating layer 141. Portions of the gate insulating layer 141 and the insulating interlayer 142 define a contact hole to expose the source and drain areas 154b and 154c of the semiconductor layer 154. In addition, portions of the insulating interlayer 142 define a fifth contact hole 89 that exposes the auxiliary line 155.

A source electrode 173, a drain electrode 175, the data line 171, and a common power line (not illustrated) are disposed or formed on the insulating interlayer 142. The source electrode 173 and the drain electrode 175 are connected to the source area 154b and the drain area 154c of the semiconductor layer 154, respectively, through a contact hole.

The data line 171 contacts the auxiliary line 155 at the fourth contact hole 88 of the gate insulating layer 141 and the fifth contact hole 89 of the insulating interlayer 142. Since the data line 171 is connected to the auxiliary line 155, the data line 171 may function as a double line, and a signal delay may be reduced in the data line 171.

In an exemplary embodiment, the source electrode 173, the drain electrode 175, the data line 171 and the common power line may include or be formed of a refractory metal selected from: molybdenum, chromium, tantalum, and titanium, or an alloy thereof; and may have a multilayer structure including a refractory metal layer and a relatively low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer.

Accordingly, a thin film transistor may be provided, including the semiconductor layer 154, the gate electrode 124, the source electrode 173 and the drain electrode 175. However, the configurations of the thin film transistor are not limited thereto, and are susceptible to various modifications.

A passivation layer 143 is formed on the insulating interlayer 142 to cover the source electrode 173 and the drain electrode 175, for example. The passivation layer 143 may include or be formed of an organic material, such as polyacrylate and polyimide. The passivation layer 143 may be a planarization layer.

The passivation layer 143 may include or be formed of at least one selected from: a polyacrylate resin, an epoxy resin, a phenolic resin, a polyamide resin, a polyimide resin, an unsaturated polyester resin, a poly-phenylenether resin, a poly-phenylenesulfide resin, and benzocyclobutene (BCB).

Portions of the passivation layer 143 may define a drain contact hole 84 that exposes the drain electrode 175.

A first electrode 710 is formed on the passivation layer 143, and the first electrode 710 is connected to the drain electrode 175 at the drain contact hole 84 of the passivation layer 143.

A pixel defining layer 190 is disposed or formed on the passivation layer 143 to cover the first electrode 710. Portions of the pixel defining layer 190 define an aperture 199 that exposes the first electrode 710.

That is, the first electrode 710 is disposed to correspond to the aperture 199 of the pixel defining layer 190. The pixel defining layer 190 may include or be formed of a polyacrylate-based resin and a polyimide-based resin, for example.

Further, the pixel defining layer 190 may include or be formed of a photosensitive organic material or a photosensitive polymer material. In an exemplary embodiment, for example, the pixel defining layer 190 may include or be formed of one of polyacrylate, polyimide, photo sensitive polyimide ("PSPI"), photosensitive acryl ("PA") and a photosensitive novolak resin.

An organic light emitting layer 720 is disposed or formed on the first electrode 710 within the aperture 199 of the pixel defining layer 190, and a second electrode 730 is disposed or formed on the pixel defining layer 190 and the organic light emitting layer 720.

Accordingly, an OLED 700 that includes the first electrode 710, the organic light emitting layer 720 and the second electrode 730 is provided.

A second substrate 201 is attached to the first substrate 110 to seal the OLED 700 and other layers of the OLED display device therebetween. The second substrate 201 covers the thin film transistor, the OLED 700, and the like which are disposed or formed on the first substrate 110, to be sealed and protected such elements from an external environment of the OLED display device. The second substrate 201 may typically include an insulating substrate including or being formed of glass or plastic, for example. Where the OLED device is a top-emission type in which an image is displayed toward the second substrate 201, the second substrate 201 may include a light-transmissive material.

In an exemplary embodiment, although not illustrated, within the OLED device of FIG. 9, the gate line may contact the auxiliary line 155 as illustrated in the exemplary embodiment of FIGS. 4 and 5, and the auxiliary line 155 may be connected to each of the gate line and the data line 171 as illustrated in the exemplary embodiment of FIG. 7.

Hereinafter, yet another exemplary embodiment of the display device will be described with reference to FIG. 10. The same configurations as configurations of the exemplary embodiment of FIGS. 1-3 will be omitted for conciseness. In the exemplary embodiment of the display device of FIG. 10, an LCD device including a top-gate thin film transistor is described.

Figure 10:
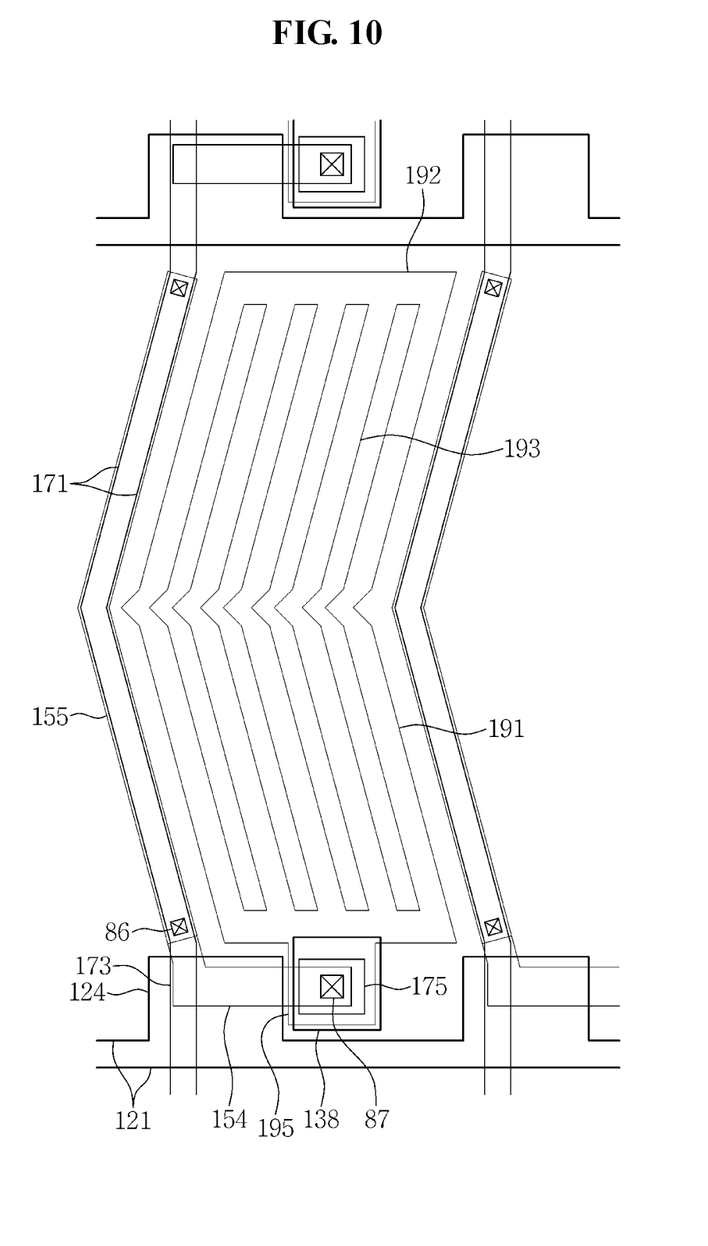
FIG. 10 is a schematic top plan view illustrating yet another exemplary embodiment of a display device.
Figure 11:
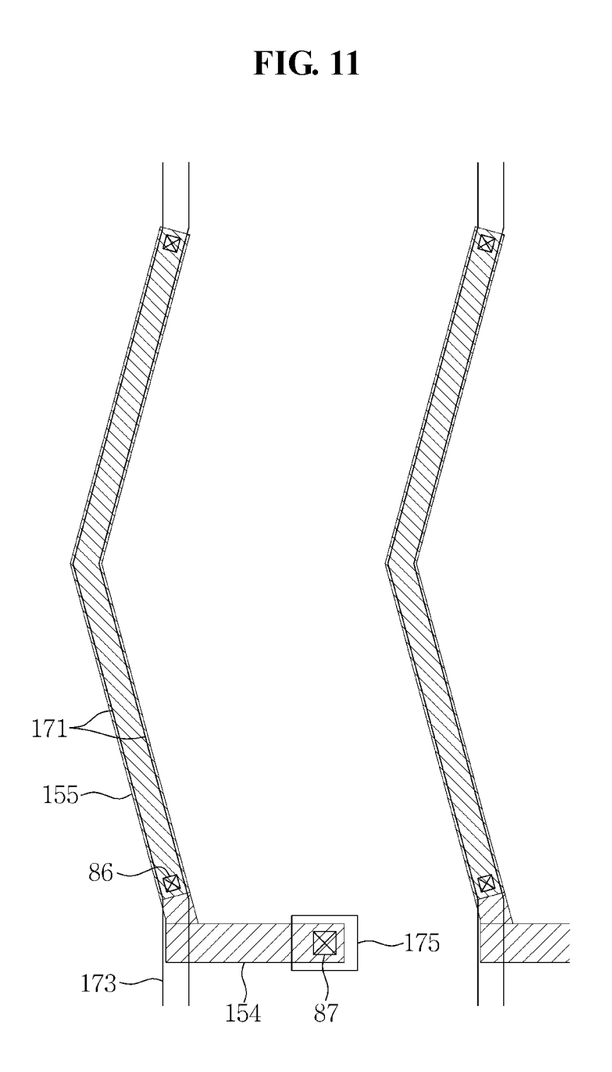
FIG. 11 is a schematic plan view illustrating an exemplary embodiment of an auxiliary line and a data line of the display device of FIG. 10.

FIG. 10 is a schematic top plan view illustrating yet another exemplary embodiment of a display device; and FIG. 11 is a schematic top plan view illustrating an exemplary embodiment of an auxiliary line and a data line of the display device of FIG. 10.

Referring to FIGS. 10 and 11, an auxiliary line 155 may be connected to a semiconductor layer 154. That is, a data signal transmitted to a data line 171 may be transmitted through the data line 171 and to the semiconductor layer 154 through a source electrode 173 or may be transmitted directly to the semiconductor layer 154 through the auxiliary line 155. Other configurations of the exemplary embodiment are the same as the configurations of the exemplary embodiment in FIGS. 1-3, and thus descriptions pertaining thereto will be omitted.

The auxiliary line 155 may be connected to the semiconductor layer 154 at the second contact hole 86, but the invention is not limited thereto. One of the auxiliary line 155 and the semiconductor layer 154 may be extended to define the other one of the auxiliary line 155 and the semiconductor layer 154, such as to form a single, unitary conductive member.

Although not illustrated, the data line 171 may not be connected to the auxiliary line 155, while the gate line 121 may be connected to the auxiliary line 155, different from the configuration of FIGS. 10 and 11. In such an exemplary embodiment, the auxiliary line 155 may still be connected to the semiconductor layer 154.

In an exemplary embodiment, although not illustrated in the drawings with respect to the exemplary embodiments of FIGS. 1-9, impurities may be injected to the auxiliary line 155 through an ion injection process. The auxiliary line 155 doped with the impurities may be cured as a metal, and thus a signal transmission function may be improved.

As set forth above, according to one or more exemplary embodiments, the auxiliary line that includes a same material or is formed from a material layer as the semiconductor layer is connected to a signal line such that a resistive-capacitive ("RC") delay of the signal line may be improved.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:
1. A display device comprising:
a substrate;
a thin film transistor disposed on the substrate and comprising a gate electrode, a source electrode, a drain electrode and a semiconductor layer;
a gate line disposed on the substrate and including the gate electrode;

a data line disposed on the substrate and including the source electrode;

a first electrode connected to one of the source electrode and the drain electrode;

an auxiliary line disposed on the substrate and comprising a same material as that of the semiconductor layer, a length of the auxiliary line extended in a same direction as a length of the gate line to overlap the gate line along the length of the gate line to reduce resistive-capacitive delay of the gate line; and a first insulating layer disposed between the gate line and the auxiliary line, the first insulating layer defining a first contact hole which exposes the gate line, wherein the gate line contacts the auxiliary line comprising the same material as that of the semiconductor layer and extended in the same direction as the length of the gate line to overlap the gate line along the length of the gate line, at the first contact hole.

2. The display device as claimed in claim 1, wherein among layers disposed on the substrate, the auxiliary line is disposed in a same layer as a layer in which the semiconductor layer is disposed.

3. The display device as claimed in claim 2, wherein the auxiliary line is disconnected from the semiconductor layer.

4. The display device as claimed in claim 2, wherein the auxiliary line is connected to the semiconductor layer.

5. The display device as claimed in claim 1, wherein the first electrode is provided in plural, and the auxiliary line is disposed between adjacent first electrodes.

6. The display device as claimed in claim 1, further comprising:

a light emitting layer on the first electrode; and a second electrode on the light emitting layer.

7. A display device comprising:

a substrate;

a thin film transistor disposed on the substrate and comprising a gate electrode, a source electrode, a drain electrode and a semiconductor layer;

a gate line disposed on the substrate and including the gate electrode;

a data line disposed on the substrate and including the source electrode;

a first electrode connected to one of the source electrode and the drain electrode;

an auxiliary line disposed on the substrate and comprising a same material as that of the semiconductor layer, a length of the auxiliary line extended in a same direction as a length of the data line to overlap the data line along the length of the data line to reduce resistive-capacitive delay of the data line; and a first insulating layer disposed between the data line and the auxiliary line, the first insulating layer defining a first contact hole which exposes the data line, wherein the data line contacts the auxiliary line comprising the same material as that of the semiconductor layer and extended in the same direction as the length of the data line to overlap the data line along the length of the data line, at the first contact hole.

8. The display device as claimed in claim 7, wherein among layers disposed on the substrate, the auxiliary line is disposed in a same layer as a layer in which the semiconductor layer is disposed.

9. The display device as claimed in claim 8, wherein the auxiliary line is disconnected from the semiconductor layer.

10. The display device as claimed in claim 8, wherein the auxiliary line is connected to the semiconductor layer.

11. The display device as claimed in claim 7, wherein the first electrode is provided in plural, and the auxiliary line is disposed between adjacent first electrodes.

12. The display device as claimed in claim 7, further comprising:

a light emitting layer on the first electrode; and a second electrode on the light emitting layer.

13. A display device comprising:

a substrate;

a thin film transistor disposed on the substrate and comprising a gate electrode, a source electrode, a drain electrode and a semiconductor layer;

a gate line disposed on the substrate and including the gate electrode;

a data line disposed on the substrate and including the source electrode;

a first electrode connected to one of the source electrode and the drain electrode;

a first auxiliary line disposed on the substrate and comprising a same material as that of the semiconductor layer, a length of the first auxiliary line extended in a same direction as a length of the gate line to overlap the gate line along the length of the gate line to reduce resistive-capacitive delay of the gate line;

a second auxiliary line disposed on the substrate and comprising the same material as that of the semiconductor layer, a length of the second auxiliary line extended in a same direction as a length of the data line to overlap the data line along the length of the data line to reduce resistive-capacitive delay of the data line;

a first insulating layer disposed between the gate line and the first auxiliary line, the first insulating layer defining a first contact hole which exposes the gate line; and a second insulating layer disposed between the data line and the second auxiliary line, the second insulating layer defining a second contact hole which exposes the data line, wherein the gate line contacts the first auxiliary line extended in the same direction as the length of the gate line to overlap the gate line along the length of the gate line, at the first contact hole, and the data line contacts the second auxiliary line extended in the same direction as the length of the data line to overlap the data line along the length of the data line, at the second contact hole.

14. The display device as claimed in claim 13, wherein among layers disposed on the substrate, the first auxiliary line and the second auxiliary line are each disposed in a same layer as a layer in which the semiconductor layer is disposed.

15. The display device as claimed in claim 14, wherein the first auxiliary line is disconnected from the second auxiliary line.

16. The display device as claimed in claim 14, wherein the first auxiliary line is connected to the semiconductor layer.

17. The display device as claimed in claim 14, wherein the second auxiliary line is connected to the semiconductor layer.

18. The display device as claimed in claim 13, wherein the first electrode is provided in plural, and the first auxiliary line and the second auxiliary line are respectively disposed between adjacent first electrodes.

19. A display device comprising:

a substrate;

a thin film transistor disposed on the substrate and comprising a semiconductor layer;
a gate line and a data line disposed on the substrate and each connected to the thin film transistor;
an auxiliary line disposed on the substrate and comprising a same material as that of the semiconductor layer, an entire length of the auxiliary line extended in a same direction as a length of the gate line to overlap the gate line along the gate line to reduce resistive-capacitive delay of the gate line;
a first insulating layer disposed between the gate line and the auxiliary line, the first insulating layer defining a first contact hole which exposes the gate line; and
a first electrode connected to a drain electrode of the thin film transistor,
wherein the gate line contacts the auxiliary line comprising the same material as that of the semiconductor layer and extended in the same direction as the gate line to overlap the gate line along the length of the gate line, at the first contact hole.

\* \* \* \* \*